(12) United States Patent
Kawai et al.

(10) Patent No.: US 11,330,713 B2
(45) Date of Patent: May 10, 2022

(54) PRINTED WIRING BOARD

(71) Applicant: IBIDEN CO., LTD., Gifu (JP)

(72) Inventors: Satoru Kawai, Ogaki (JP); Yasuki Kimishima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/230,457

(22) Filed: Apr. 14, 2021

(65) Prior Publication Data
US 2021/0329783 A1    Oct. 21, 2021

(30) Foreign Application Priority Data

Apr. 17, 2020   (JP) .............................. JP2020-073845

(51) Int. Cl.
*H05K 1/11*    (2006.01)

(52) U.S. Cl.
CPC ..... H05K 1/115 (2013.01); *H05K 2201/0338* (2013.01); *H05K 2201/09545* (2013.01)

(58) Field of Classification Search
CPC ........ H05K 1/112; H05K 1/113; H05K 1/115; H05K 1/116; H05K 1/165; H05K 2201/09536; H05K 2201/09545; H05K 2201/09581; H05K 2201/0959; H05K 2201/09654; H05K 2201/0979; H05K 2201/09818; H05K 2201/09881; H05K 2201/09909; H05K 2201/09972; H01F 2017/002

See application file for complete search history.

(56) References Cited

U.S. PATENT DOCUMENTS

2007/0257761 A1* 11/2007 Mano .................. H05K 3/4046
                                                                  336/200
2018/0315519 A1* 11/2018 Sugiura .................... C09D 7/68

FOREIGN PATENT DOCUMENTS

EP        3800651 A1 *  4/2021      ............. H05K 1/116
JP        2019-129278 A   8/2019

OTHER PUBLICATIONS

Hagiwara (EP 3800651) provided with Office Action (Year: 2021).*

* cited by examiner

*Primary Examiner* — Roshn K Varghese
(74) *Attorney, Agent, or Firm* — Oblon, McClelland, Maier & Neustadt, L.L.P.

(57) ABSTRACT

A printed wiring board includes an insulating substrate having openings, a first conductor layer formed on a first surface of the insulating substrate, a second conductor layer formed on a second surface of the insulating substrate, magnetic material portions formed in the openings of the insulating substrate and having through holes extending from the first surface to second surface of the insulating substrate, and through-hole conductors formed on side walls of the through holes such that the through-hole conductors connect the first conductor layer and second conductor layer. The magnetic material portions include magnetic particles and resin such that the magnetic particles include particles forming the side walls and that gaps are formed between the particles and the resin, and each of the through-hole conductors includes a chemical copper plating film such that the chemical copper plating film is deposited in the gaps formed between the particles and the resin.

20 Claims, 5 Drawing Sheets

PRINTED WIRING BOARD

CROSS-REFERENCE TO RELATED APPLICATIONS

The present application is based upon and claims the benefit of priority to Japanese Patent Application No. 2020-073845, filed Apr. 17, 2020, the entire contents of which are incorporated herein by reference.

BACKGROUND OF THE INVENTION

Field of the Invention

The present invention relates to a printed wiring board having through-hole conductors penetrating through magnetic material portions.

Description of Background Art

Japanese Patent Application Laid-Open Publication No. 2019-129278 describes a printed wiring board. The printed wiring board of Japanese Patent Application Laid-Open Publication No. 2019-129278 includes a core substrate having an opening, an inductor component accommodated in the opening, and a build-up layer formed on the core substrate. The inductor component has a through-hole conductor penetrating a magnetic base material. The entire contents of this publication are incorporated herein by reference.

SUMMARY OF THE INVENTION

According to one aspect of the present invention, a printed wiring board includes an insulating substrate having openings, a first conductor layer formed on the first surface of the insulating substrate, a second conductor layer formed on a second surface of the insulating substrate on the opposite side with respect to the first surface, magnetic material portions formed in the openings of the insulating substrate respectively and having first through holes extending from the first surface to the second surface of the insulating substrate, and first through-hole conductors formed on side walls of the first through holes in the magnetic material portions such that the first through-hole conductors connect the first conductor layer and the second conductor layer. The magnetic material portions includes magnetic particles and resin such that the magnetic particles include first particles forming the side walls and that gaps are formed between the first particles and the resin, and each of the first through-hole conductors includes a first chemical copper plating film such that the first chemical copper plating film is deposited in the gaps formed between the first particles and the resin.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
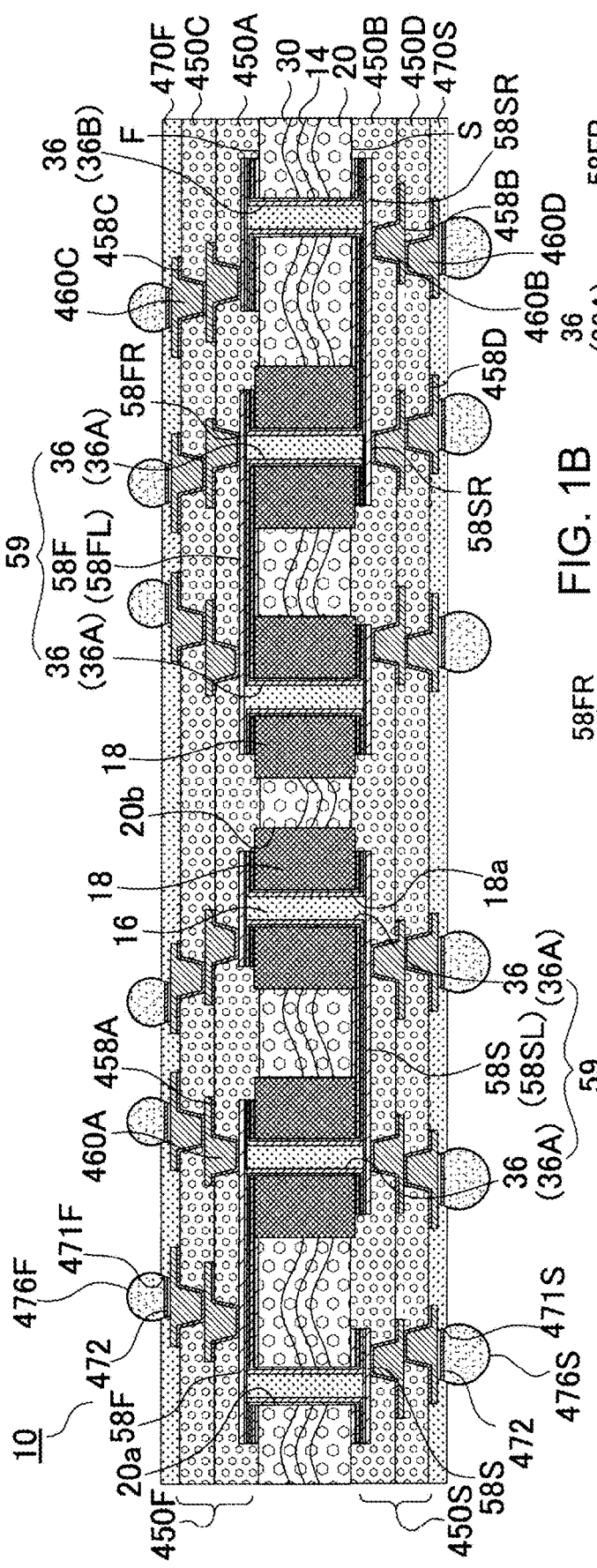
FIG. 1A is a cross-sectional view of a printed wiring board according to an embodiment of the present invention.

Embodiments will now be described with reference to the accompanying drawings, wherein like reference numerals designate corresponding or identical elements throughout the various drawings.

FIG. 1A illustrates a cross section of a printed wiring board 10 of an embodiment. The printed wiring board 10 has a core substrate 30 which is formed to include: an insulating substrate 20 having a first surface (F) and a second surface (S) on an opposite side with respect to the first surface (F); a first conductor layer (58F) on the first surface (F) of the insulating substrate 20; a second conductor layer (58S) on the second surface (S) of the insulating substrate 20; and through-hole conductors 36 connecting the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating substrate 20 are the same surface, and the second surface (S) of the core substrate 30 and the second surface (S) of the insulating substrate 20 are the same surface. The insulating substrate 20 is formed of a resin such as an epoxy resin and a reinforcing material such as a glass cloth. The insulating substrate 20 may further contain inorganic particles such as silica particles.

The printed wiring board 10 further has an upper side build-up layer (450F) on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (458C) formed on the insulating layer (450C); and via conductors (460C) penetrating the insulating layer (450C) and connecting the conductor layer (458A) and the conductor layer (458C) to each other.

The printed wiring board 10 further has a lower side build-up layer (450S) on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the conductor layer (458D) to each other.

The printed wiring board 10 of the embodiment further includes a solder resist layer (470F) formed on the upper side build-up layer (450F) and a solder resist layer (470S) formed on the lower side build-up layer (450S). The solder resist layer (470F) has openings (471F). The solder resist layer (470S) has openings (471S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, OSP, or the like is formed on each of the pads. Solder bumps (476F, 476S) are respectively formed on the protective films. An IC chip is mounted on the printed wiring board 10 via the solder bumps (476F) that are formed on the upper side build-up layer (450F). The IC chip is not illustrated in the drawings. The printed wiring board 10 is mounted on a motherboard via the solder bumps (476S) that are formed on the lower side build-up layer (450S).

Figure 1B:
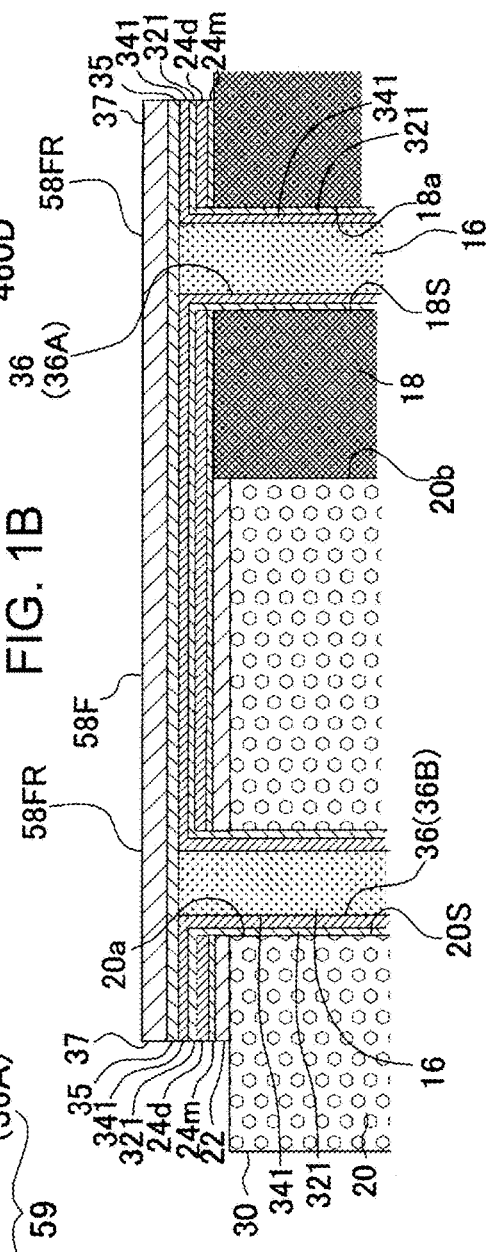
FIG. 1B is an enlarged view of a core substrate of the printed wiring board.

FIG. 1B illustrates a portion of the core substrate 30 in FIG. 1A. As illustrated in FIGS. 1A and 1B, the core substrate 30 further has openings (20b) and second through holes (20a) that penetrate the insulating substrate 20. Magnetic material portions 18 having first through holes (18a) are formed in the openings (20b). The openings (20b), the first through holes (18a), and the second through holes (20a) each extend from the first surface (F) to the second surface (S). The first through holes (18a) penetrate through the magnetic material portions 18.

Figure 5A:
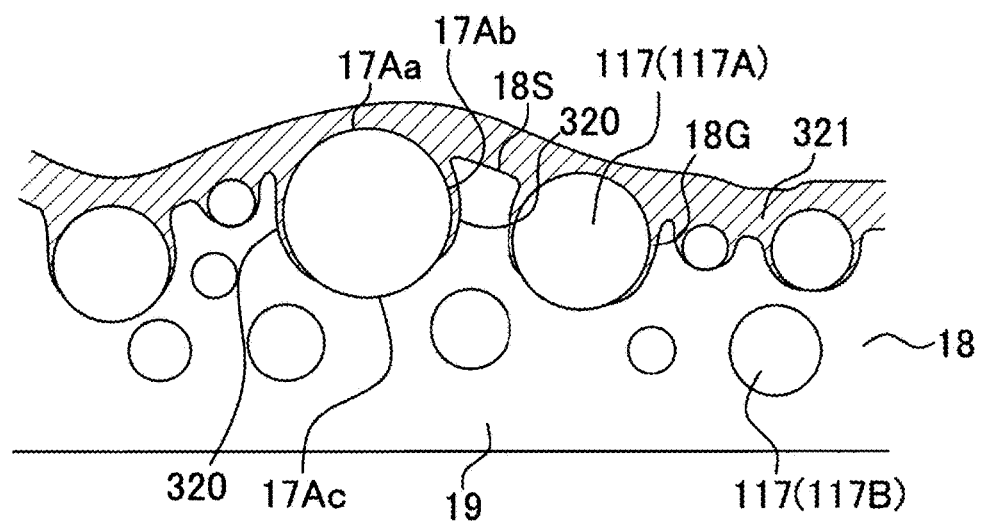
FIG. 5A is a schematic diagram illustrating the first chemical copper plating film.
Figure 5B:
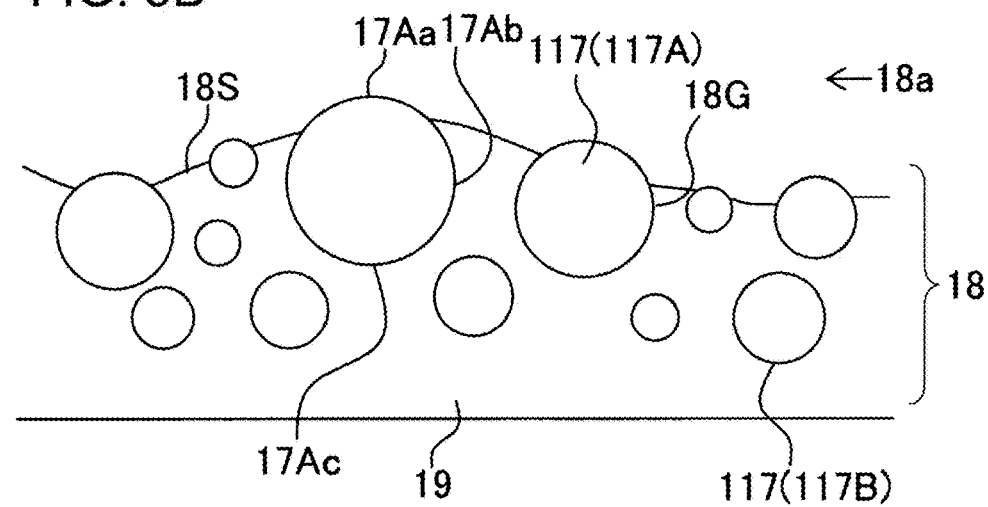
FIG. 5B is a schematic diagram illustrating magnetic material.

As illustrated in FIG. 5B, the magnetic material portion 18 contains particles (magnetic particles) 117, which are formed of magnetic bodies, and resin 19. Examples of the magnetic particles 117 include particles formed of a metal (metal particles) and particles formed of an oxide (oxide particles). Examples of the metal particles include iron particles, nickel particles, and cobalt particles. The iron particles are preferred. Examples of the oxide particles include iron (II) oxide, iron (III) oxide, $MnFe_2O_4$, $CoFe_2O_4$, $NiFe_2O_4$, $CuFe_2O_4$, and $ZnFe_2O_4$ particles. A group of magnetic particles is formed including the metal particles and the oxide particles. The magnetic material portions 18 contain at least one type of magnetic particles 117 in the group of magnetic particles. The magnetic material portions 18 may contain multiple types of magnetic particles 117. The magnetic material portions 18 may contain one type of the metal particles and one type of the oxide particles. For example, the magnetic material portions 18 may contain iron particles and particles formed of iron (III) oxide. The magnetic material portions 18 may contain two types of the oxide particles. For example, the magnetic material portions 18 may contain iron (II) oxide particles and iron (III) oxide particles. The magnetic material portions 18 may contain iron (II) oxide particles and MnFe2O4 particles. The magnetic material portions 18 may contain iron (III) oxide particles and MnFe2O4 particles. The magnetic material portions 18 may contain iron (II) oxide particles and ZnFe2O4 particles. The magnetic material portions 18 may contain iron (III) oxide particles and ZnFe2O4 particles. A content of the magnetic particles 117 in the magnetic material portions 18 is preferably 60% by weight or more. Magnetic permeability and thermal conductivity may be increased. Examples of the resin forming the magnetic material portions 18 include epoxy and polyimide.

Figure 5C:
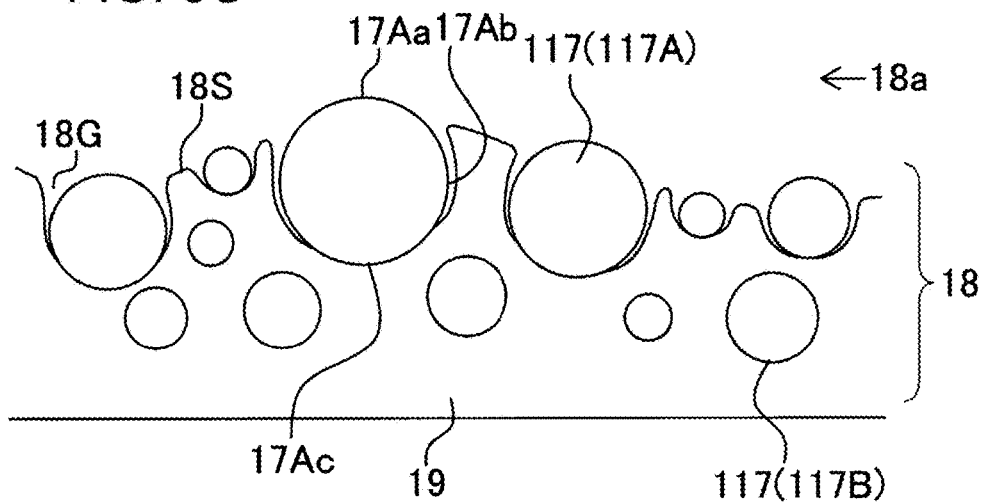
FIG. 5C is a schematic diagram illustrating gaps.

FIG. 5C illustrates a portion of a magnetic material portion 18. FIG. 5C illustrates a first through hole (18a), a magnetic material portion 18, and a side wall (18S) and gaps (18G) of the magnetic material portion 18 exposed by the first through hole (18a). The gaps (18G) are formed between the resin 19 and the magnetic particle 117. The gaps (18G) enter from the side wall (18S) into the magnetic material portion 18. The side wall (18S) is also a side wall of the first through hole (18a).

FIG. 5B illustrates a magnetic material portion 18. Approximate circles in FIG. 5B schematically illustrate the magnetic particles 117. The magnetic particles 117 include particles (first particles) (117A) exposed by the first through holes (18a) and particles (second particles) (117B) completely embedded in the resin 19.

Surfaces of the first particles (117A) exposed by the first through holes (18a) are a portion of the side wall (18S). The first particles (117A) form the side wall (18S).

As illustrated in FIG. 5C, surfaces of the first particles (117A) include surfaces (exposed surfaces) (17Aa) that form the side wall (18S) and surfaces (inner surfaces) (17Ab) that are exposed by the gaps (18G). The exposed surfaces (17Aa) are exposed by the first through holes (18a). The exposed surfaces (17Aa) and the inner surfaces (17Ab) are continuous. The surfaces of the first particles (117A) further include covered surfaces (17Ac). The covered surfaces (17Ac) are covered by the resin 19.

The magnetic particles 117 preferably do not have uniform particle sizes. The number of the first particles (117A) can be increased.

The through-hole conductors 36 include first through-hole conductors (36A) formed in the first through holes (18a) and second through-hole conductors (36B) formed in the second through holes (20a). When the through-hole conductors (36A, 36B) each have a tubular shape, a resin 16 is filled in the through-hole conductors 36.

The first conductor layer (58F) and the second conductor layer (58S) have through-hole lands (58FR, 58SR) formed around the through-hole conductors 36. The through-hole lands (58FR, 58SR) are directly connected to the through-hole conductors 36. The through-hole lands (58FR, 58SR) can cover the resin 16.

As illustrated in FIG. 1B, the second through-hole conductors (36B) are in contact with the insulating substrate 20 exposed by the second through holes (20a). The second through-hole conductors (36B) are formed by a first chemical copper plating film 321 on side walls (20S) of the second through holes (20a) and a first electrolytic copper plating film 341 on the first chemical copper plating film 321.

The first through-hole conductors (36A) are in contact with the side walls (18S) of the first through holes (18a). The first through-hole conductors (36A) are formed by a first chemical copper plating film 321 on the side walls (18S) of the first through holes (18a) and a first electrolytic copper plating film 341 on the first chemical copper plating film 321.

Figure 4:
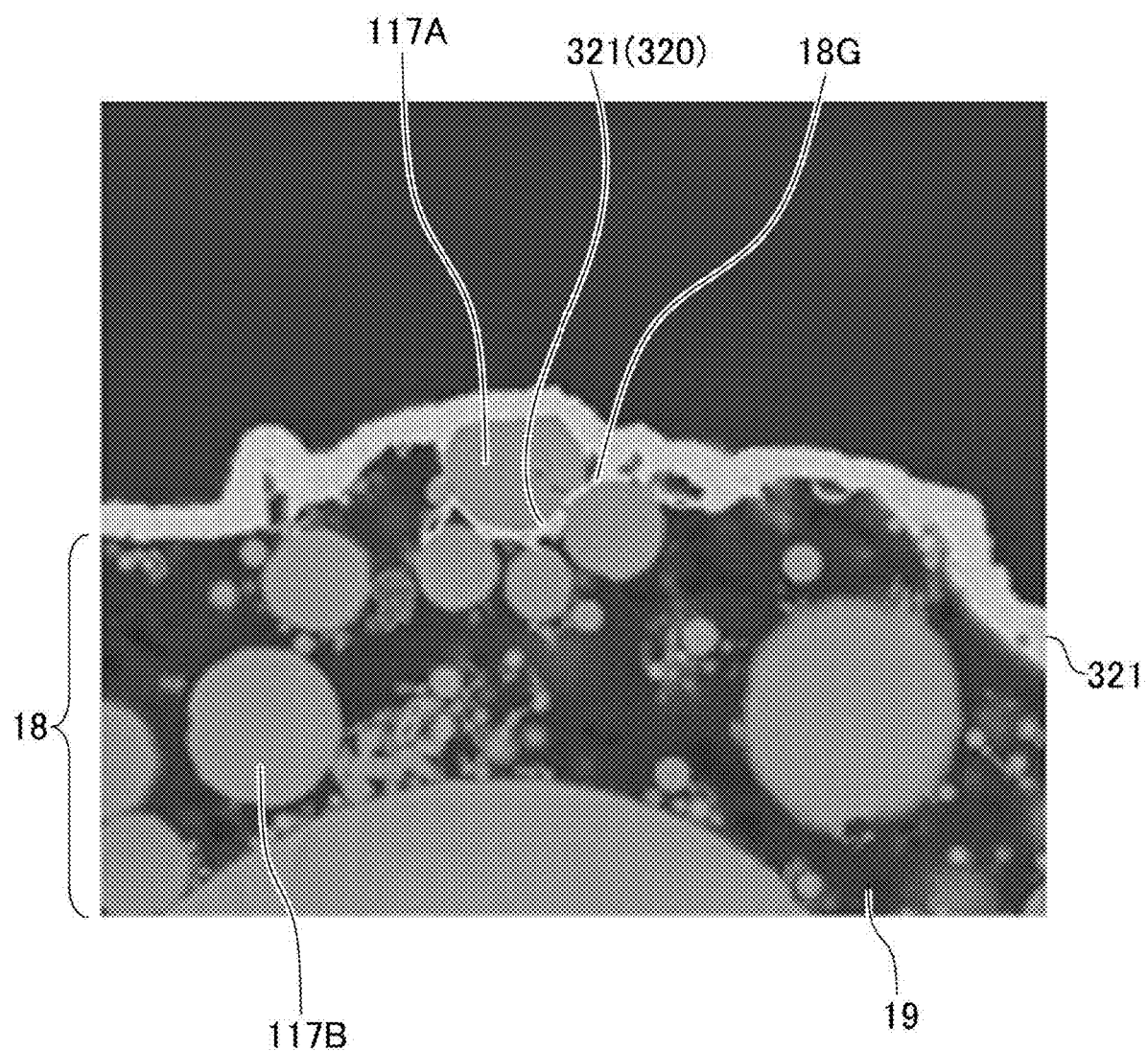
FIG. 4 is a photomicrograph showing a first chemical copper plating film.

FIG. 4 is a photomicrograph. FIG. 4 illustrates a magnetic material portion 18 and the first chemical copper plating film 321. FIG. 5A schematically illustrates the first chemical copper plating film 321 and the magnetic material portion 18. As illustrated in FIGS. 4 and 5A, the first chemical copper plating film 321 is formed on the side wall (18S). The first chemical copper plating film 321 is further deposited in the gaps (18G). The first chemical copper plating film 321 formed in the gaps (18G) is referred to as a chemical copper plating film 320. The chemical copper plating film 320 is directly connected to the first chemical copper plating film 321 on the side wall (18S). The chemical copper plating film 320 extends from the first chemical copper plating film 321 on the side wall (18S). And, the chemical copper plating film 320 enters into the gaps (18G). The chemical copper plating film 320 enters into the magnetic material portion 18. Therefore, the chemical copper plating film 320 can have an anchor effect. Even when the printed wiring board 10 is subjected to heat cycles, the first chemical copper plating film 321 is unlikely to peel off from the magnetic material portion 18.

The first chemical copper plating film 321 is formed on the inner surfaces (17Ab). The first chemical copper plating film 321 on the inner surfaces (17Ab) is the chemical copper plating film 320. The first chemical copper plating film 321 is further formed on the exposed surfaces (17Aa). The first chemical copper plating film 321 on the exposed surfaces (17Aa) is included in the first chemical copper plating film 321 on the side wall (18S).

The first chemical copper plating film 321 is not formed on surfaces of the second particles (117B) that are completely covered by the resin 19 forming the magnetic material portions 18. However, when the second particles (117B) are in contact with the first particles (117A), the first chemical copper plating film 321 is formed on the second particles (117B) that are in contact with the first particles (117A).

When the chemical copper plating film 320 is formed on the inner surfaces (17Ab) of the first particles (117A), the first particles (117A) are connected to the first chemical copper plating film 321 on the side wall (18S) via the chemical copper plating film 320. An adhesive force between the first through-hole conductors (36A) and the first particles (117A) can be increased. The first through-hole conductors (36A) can be prevented from peeling off from the magnetic material portion 18.

When the chemical copper plating film 320 is formed in the gaps (18G), the chemical copper plating film 320 enters into the magnetic material portion 18. The first chemical copper plating film 321 extends from the side wall (18S) and reaches inside of the magnetic material portion 18. An adhesive force between the first through-hole conductor (36A) and the magnetic material 18 can be increased. Even when the printed wiring board 10 is subjected to heat cycles, the first through-hole conductor (36A) is unlikely to peel off from the magnetic material portion 18.

Before the first chemical copper plating film 321 was formed, the surfaces of the magnetic particles 117 can be dissolved. The magnetic material portion 18 exposed by the first through hole (18a) is treated with an acidic aqueous solution. The side wall (18S) of the magnetic material portion 18 is washed with an acidic aqueous solution. Examples of acids include a sulfuric acid, a hydrochloric acid, a nitric acid, an oxalic acid, and a phosphoric acid. The surfaces of the magnetic particles 117 are dissolved. The treatment liquid can contain an oxidizing agent. As a result, as illustrated in FIG. 5C, the gaps (18G) are formed between the magnetic particles 117 and the resin 19 forming the magnetic material portion 18.

The magnetic material portion 18 is in contact with sidewall of the insulating substrate 20 exposed by the opening (20b). The number of the first through holes (18a) positioned in each one of the openings (20b) is 1. The number of the first through holes (18a) formed in each one of the magnetic material portions 18 is 1. Therefore, a diameter of each of the openings (20b) can be reduced. A volume of each of the magnetic material portions 18 in the openings (20b) can be reduced. A thermal expansion coefficient of the insulating substrate 20 and a thermal expansion coefficient of the magnetic material portions 18 are different from each other. Even when the magnetic material portions 18 are in contact with the insulating substrate 20, a stress caused by the difference in thermal expansion coefficient between the two can be reduced. Since the chemical copper plating film 320 contributes to the adhesive strength between the magnetic material portions 18 and the first through-hole conductors (36A), the adhesion between the magnetic material portions 18 and the first through-hole conductors (36A) is stable over a long time. The first through-hole conductors (36A) are unlikely to peel off from the magnetic material portions 18. A diameter of each of the first through holes (18a) can be reduced. A spacing between adjacent first through-hole conductors (36A) can be reduced.

The first conductor layer (58F) can include first connection wirings (58FL) that each connect two of the first through-hole conductors (36A) to each other. The second conductor layer (58S) can include second connection wirings (58SL) that each connect two of the first through-hole conductors (36A) to each other. The multiple first through-hole conductors (36A) are connected in series via the first connection wirings (58FL) and the second connection wirings (58SL). An inductor 59 is formed by the multiple first through-hole conductors (36A), the multiple first connection wirings (58FL) and the multiple second connection wirings (58SL). In the inductor 59, the first through-hole conductors (36A), the first connection wirings (58FL) and the second connection wirings (58SL) are formed in the order of the first connection wirings (58FL), the first through-hole conductors (36A), and the second connection wirings (58SL). The wirings forming the inductor 59 extend in a direction parallel to the first surface (F).

Method for Manufacturing Printed Wiring Board

Figure 2A:
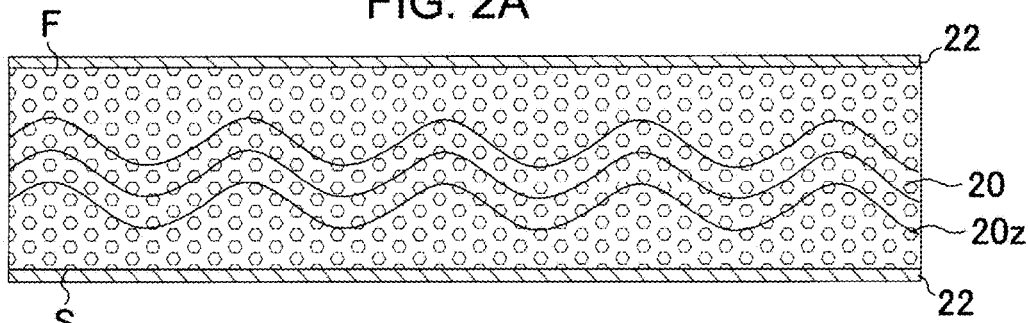
FIGS. 2A-2E are process diagrams illustrating a method for manufacturing a printed wiring board according to an embodiment of the present invention.
Figure 2B:
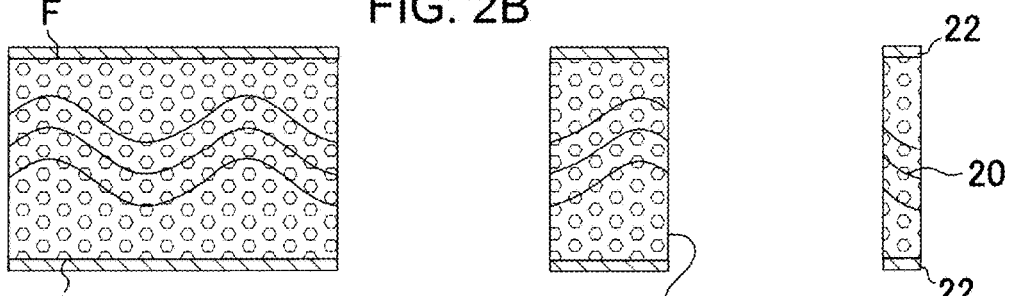
Figure 2C:
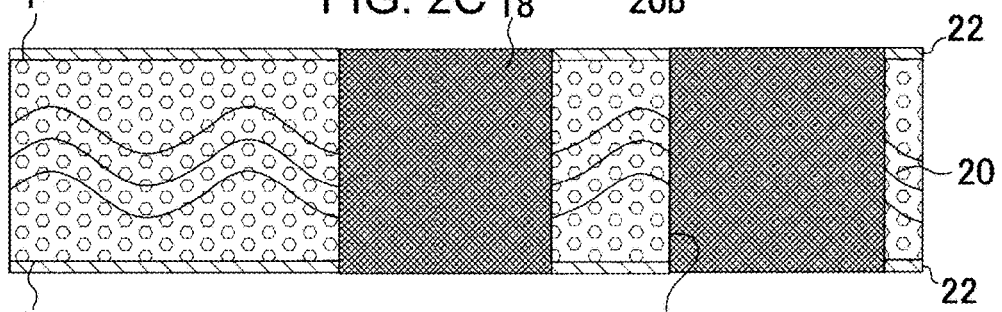

FIGS. 2A-2E and 3A-3D illustrate a method for manufacturing the printed wiring board 10 according to an embodiment of the present invention. A copper-clad laminated plate (20z) is prepared (FIG. 2A). The copper-clad laminated plate (20z) is formed of the insulating substrate 20 and a copper foil 22 laminated on both sides of the insulating substrate 20. The openings (20b) are formed in the insulating substrate 20 (FIG. 2B). The magnetic material 18 are respectively filled in the openings (20b) by printing. The magnetic material 18 is formed of iron (III) oxide magnetic particles 117 and an epoxy resin 19. An amount of iron (III) oxide in the magnetic material 18 is 90 wt %.

Figure 2D:
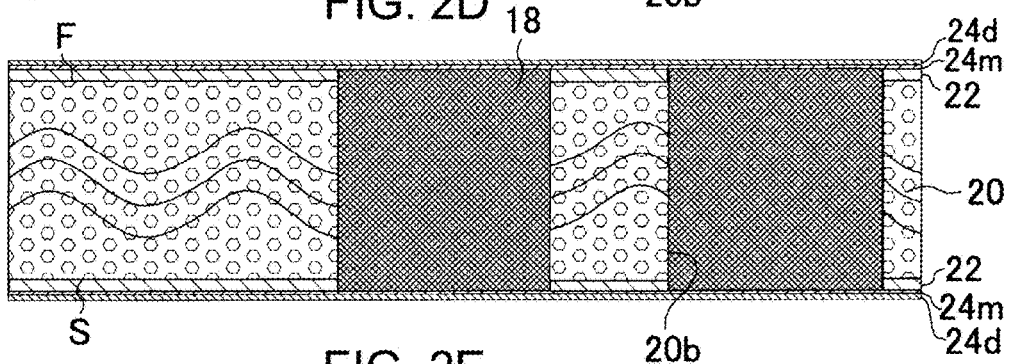

A chemical plating film (24m) and an electrolytic plating film (24d) are formed on the copper foil 22 and the magnetic material portions 18 (FIG. 2D). The chemical plating film (24m) and the electrolytic plating film (24d) on the chemical plating film (24m) are formed of copper.

Figure 2E:
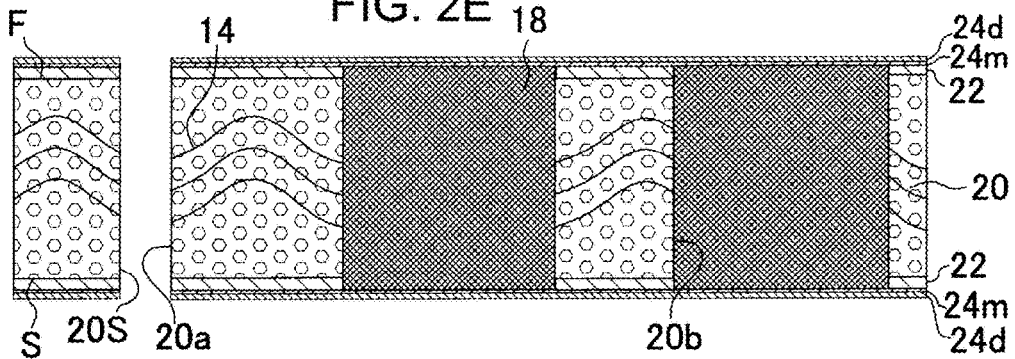

The second through holes (20a) are formed in the insulating substrate 20 (FIG. 2E). After that, the side walls (20S) of the second through holes (20a) are washed with a chemical solution. An example of the chemical solution is a potassium permanganate aqueous solution. In this case, the magnetic material portions 18 are covered by the chemical plating film (24m) and the electrolytic plating film (24d). The magnetic material portions 18 are not affected by the chemical solution. Oxidation of the magnetic particles 117 can be suppressed.

Figure 3A:
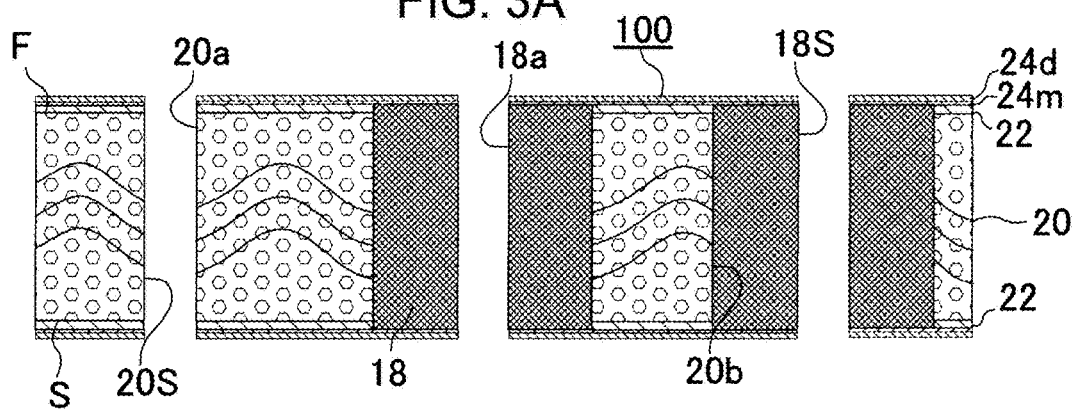
FIGS. 3A-3D are process diagrams illustrating the method for manufacturing a printed wiring board according to the embodiment.

The first through holes (18a) are respectively formed in the magnetic material portions 18. The side walls (18S) of the first through holes (18a) are washed by high-pressure water washing. An intermediate substrate 100 having the first through holes (18a) is immersed in an acidic aqueous solution. An example of an acid is a phosphoric acid. A concentration of the phosphoric acid is 100 g/L or more and 200 g/L or less. The intermediate substrate 100 is illustrated in FIG. 3A. The surfaces of the first particles (117A) are dissolved. As illustrated in FIG. 5C, the gaps (18G) are formed between the resin 19 and the first particles (117A). After that, a catalyst for forming the first chemical copper plating film 321 is formed on the intermediate substrate 100 having the gaps (18G).

The first chemical copper plating film 321 is formed on the side walls (18S) of the first through holes (18*a*). In this case, the first chemical copper plating film 321 is also formed in the gaps (18G). The first chemical copper plating film 321 on the side walls (18S) and the first chemical copper plating film 321 in the gaps (18G) are continuous.

At the same time, the first chemical copper plating film 321 is formed on the side walls (20S) of the second through holes (20*a*). The first chemical copper plating film 321 is also formed on the electrolytic plating film (24*d*).

Figure 3B:
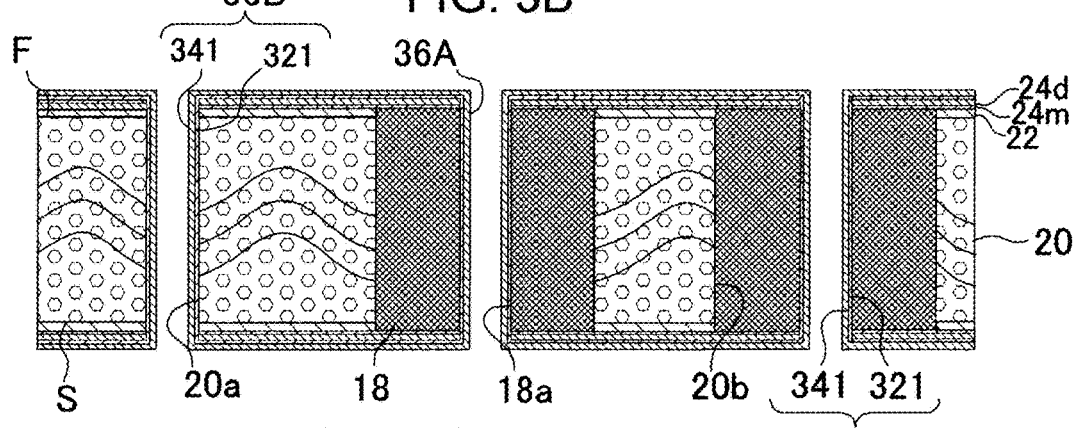

The first electrolytic copper plating film 341 is formed on the first chemical copper plating film 321. The first through-hole conductors (36A) are respectively formed in the first through holes (18*a*). The second through-hole conductors (36B) are respectively formed in the second through holes (20*a*) (FIG. 3B). The first through-hole conductors (36A) and the second through-hole conductors (36B) are formed by the first chemical copper plating film 321 and the first electrolytic copper plating film 341 on the first chemical copper plating film 321.

Figure 3C:
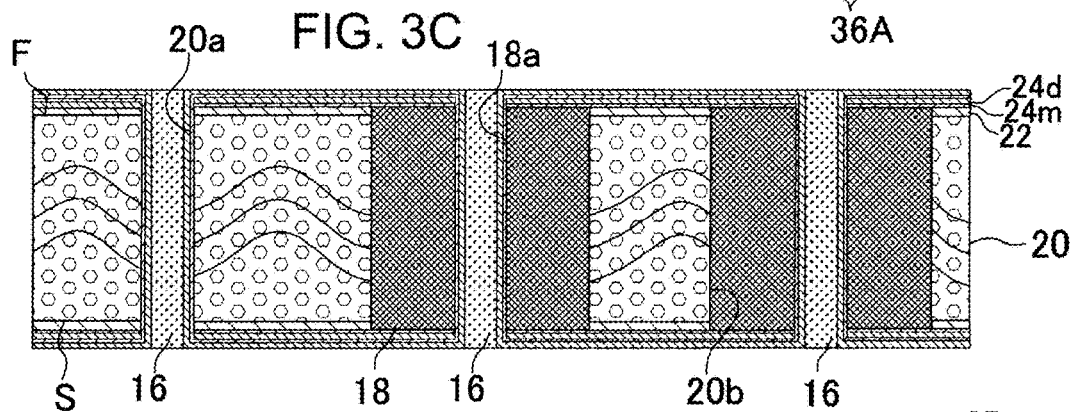
Figure 3D:
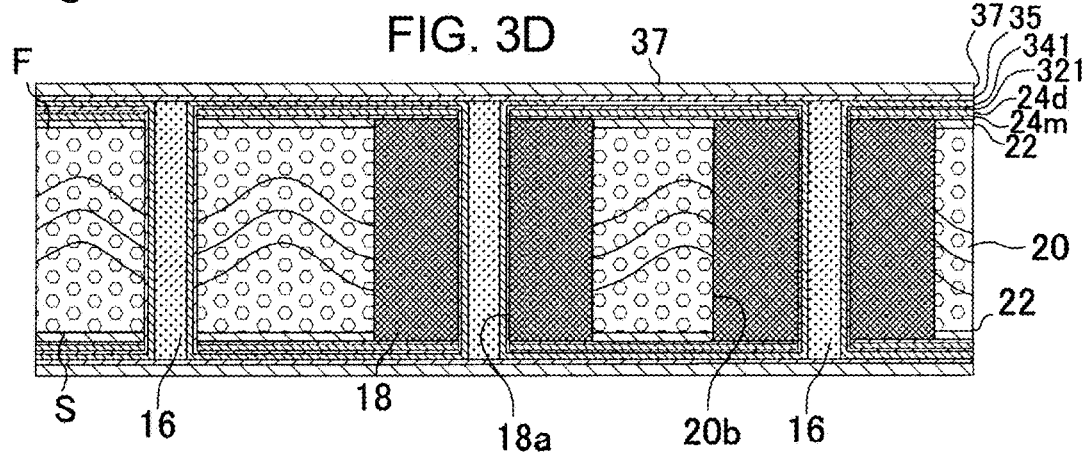

The resin 16 is filled in the first through-hole conductors (36A) and the second through-hole conductors (36B) (FIG. 3C). A third chemical plating film 35 is formed on the first electrolytic copper plating film 341 and the resin 16. A third electrolytic plating film 37 is formed on the third chemical plating film 35 (FIG. 3D). An etching resist is formed on the third electrolytic plating film 37.

The third electrolytic plating film 37, the third chemical plating film 35, the first electrolytic copper plating film 341, the first chemical copper plating film 321, the electrolytic plating film (24*d*), the chemical plating film (24*m*), and the copper foil 22 that are exposed from the etching resist are removed. The etching resist is removed. The first conductor layer (58F) and the second conductor layer (58S) are formed. The core substrate 30 is completed. The first conductor layer (58F) and the second conductor layer (58S) formed on the magnetic material portions 18 do not include the copper foil 22. The first conductor layer (58F) and the second conductor layer (58S) on the magnetic materials 18 are formed by the chemical plating film (24*m*), the electrolytic plating film (24*d*), the first chemical copper plating film 321, the first electrolytic copper plating film 341, the third chemical plating film 35, and the third electrolytic plating film 37. The first conductor layer (58F) and the second conductor layer (58S) on the magnetic materials 18 are formed by the chemical plating films and the electrolytic plating films.

The first conductor layer (58F) and the second conductor layer (58S) formed on the insulating substrate 20 include the copper foil 22. The first conductor layer (58F) and the second conductor layer (58S) on the insulating substrate 20 are formed by the copper foil 22, the chemical plating film (24*m*), the electrolytic plating film (24*d*), the first chemical copper plating film 321, the first electrolytic copper plating film 341, the third chemical plating film 35, and the third electrolytic plating film 37. The first conductor layer (58F) and the second conductor layer (58S) on the insulating substrate 20 are formed by the copper foil 22, the chemical plating films and the electrolytic plating films.

The upper side build-up layer (450F), the lower side build-up layer (450S), and the solder resist layers (470F, 470S) may be formed on the core substrate 30 using known manufacturing methods (FIG. 1A). The printed wiring board 10 can have the solder bumps (476F, 476S).

In Japanese Patent Application Laid-Open Publication No. 2019-129278, iron filler particles and iron (III) oxide particles are included as examples of magnetic particles forming the magnetic base material. The through-hole conductor of Japanese Patent Application Laid-Open Publication No. 2019-129278 includes a chemical plating seed layer. And, in Japanese Patent Application Laid-Open Publication No. 2019-129278, nickel chemical plating and nickel-copper chemical plating are included as examples of plating for forming the chemical plating seed layer. The chemical plating seed layer of Japanese Patent Application Laid-Open Publication No. 2019-129278 contains nickel. Therefore, when the printed wiring board of Japanese Patent Application Laid-Open Publication No. 2019-129278 is subjected to heat cycles, it is expected that peeling occurs between the magnetic base material and the through-hole conductor.

A printed wiring board according to an embodiment of the present invention includes: an insulating substrate that has a first surface and a second surface on an opposite side with respect to the first surface, and has openings each extending from the first surface to the second surface; magnetic materials that are formed in the openings and have first through holes each extending from the first surface to the second surface; a first conductor layer formed on the first surface; a second conductor layer formed on the second surface; and first through-hole conductors that are formed on side walls of the first through holes and connect the first conductor layer and the second conductor layer to each other. The first through-hole conductors include a first chemical copper plating film. The magnetic materials contain particles formed of a magnetic material (magnetic particles) and a resin. The magnetic particles include particles (first particles) that form the side walls. Gaps are formed between the first particles and the resin. The first chemical copper plating film is deposited in the gaps.

A printed wiring board according to an embodiment of the present invention has gaps between the first particles forming the magnetic materials and the resin forming the magnetic materials. The first chemical copper plating film that forms the first through-hole conductors is deposited in the gaps. The first chemical copper plating film enters into the gaps. The first chemical copper plating film formed in the gaps can be referred to as a chemical copper plating film. In the embodiment, the first chemical copper plating film includes the chemical copper plating film, and thus, contributes to the adhesion strength between the first through-hole conductors and the magnetic materials. Therefore, in the embodiment, the adhesion between the first through-hole conductors and the magnetic materials is maintained over a long time. Connection reliability via the first through-hole conductors formed on the magnetic materials can be increased.

The chemical copper plating film directly extends from the first chemical copper plating film. When the first chemical copper plating film and the chemical copper plating film are continuous, the contribution of the chemical copper plating film can be increased.

In the embodiment, the magnetic materials are in direct contact with the insulating substrate. Therefore, it is thought that a stress caused by a difference in thermal expansion coefficient between the two directly acts on the magnetic materials. Due to the stress, the adhesion strength between the first through-hole conductors and the magnetic materials is expected to decrease. Or, the first through-hole conductors are expected to be disconnected. However, in the embodiment, the chemical copper plating film contributes to the adhesion strength between the first through-hole conductors and the magnetic materials. Therefore, such a problem is unlikely to occur.

The printed wiring board of the embodiment has the multiple openings. The magnetic materials are formed in the openings. Each of the magnetic materials has one first through hole. Therefore, a volume of each of the magnetic materials can be reduced. Therefore, stress acting between the magnetic materials and the first through-hole conductors can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an insulating substrate having a plurality of openings;
   a first conductor layer formed on a first surface of the insulating substrate;
   a second conductor layer formed on a second surface of the insulating substrate on an opposite side with respect to the first surface;
   a plurality of magnetic material portions formed in the plurality of openings of the insulating substrate respectively and having a plurality of through holes extending from the first surface to the second surface of the insulating substrate; and
   a plurality of through-hole conductors formed on side walls of the through holes in the magnetic material portions such that the plurality of through-hole conductors connects the first conductor layer and the second conductor layer,
   wherein the plurality of magnetic material portions comprises magnetic particles and resin such that the magnetic particles include particles forming the side walls and that gaps are formed between the particles and the resin, and each of the through-hole conductors includes a chemical copper plating film such that the chemical copper plating film is deposited in the gaps formed between the particles and the resin.

2. The printed wiring board according to claim 1, wherein the chemical copper plating film does not contain Ni.

3. The printed wiring board according to claim 2, wherein the magnetic particles comprises a metal.

4. The printed wiring board according to claim 3, wherein the magnetic particles are selected from the group consisting of iron particles, nickel particles and cobalt particles.

5. The printed wiring board according to claim 2, wherein the magnetic particles are selected from the group consisting of iron (II) oxide, iron (III) oxide, $MnFe_2O_4$, $CoFe_2O_4$, $NiFe_2O_4$, $CuFe_2O_4$ and $ZnFe_2O_4$ particles.

6. The printed wiring board according to claim 2, wherein each of the through-hole conductors includes the chemical copper plating film formed directly on the side walls and an electrolytic copper plating film formed on the chemical copper plating film.

7. The printed wiring board according to claim 2, wherein the particles have exposed surfaces exposed by the through holes and inner surfaces exposed by the gaps such that the chemical copper plating film is formed on the inner surfaces of the particles.

8. The printed wiring board according to claim 7, wherein the chemical copper plating film is further formed on the exposed surfaces of the particles.

9. The printed wiring board according to claim 2, wherein the plurality of magnetic material portions are in contact with side walls of the insulating substrate exposed by the plurality of openings.

10. The printed wiring board according to claim 1, wherein the magnetic particles comprises a metal.

11. The printed wiring board according to claim 10, wherein the magnetic particles are selected from the group consisting of iron particles, nickel particles and cobalt particles.

12. The printed wiring board according to claim 1, wherein the magnetic particles are selected from the group consisting of iron (II) oxide, iron (III) oxide, $MnFe_2O_4$, $CoFe_2O_4$, $NiFe_2O_4$, $CuFe_2O_4$ and $ZnFe_2O_4$ particles.

13. The printed wiring board according to claim 1, wherein the gaps are formed by dissolving the magnetic particles.

14. The printed wiring board according to claim 13, wherein the dissolving includes immersing the magnetic materials in an acidic aqueous solution.

15. The printed wiring board according to claim 1, wherein each of the through-hole conductors includes the chemical copper plating film formed directly on the side walls and an electrolytic copper plating film formed on the chemical copper plating film.

16. The printed wiring board according to claim 1, wherein the particles have exposed surfaces exposed by the through holes and inner surfaces exposed by the gaps such that the chemical copper plating film is formed on the inner surfaces of the particles.

17. The printed wiring board according to claim 16, wherein the chemical copper plating film is further formed on the exposed surfaces of the particles.

18. The printed wiring board according to claim 1, wherein the plurality of magnetic material portions are in contact with side walls of the insulating substrate exposed by the plurality of openings.

19. The printed wiring board according to claim 1, wherein the plurality of magnetic material portions is formed such that a number of the through holes formed in each of the magnetic material portions is one.

20. The printed wiring board according to claim 1, wherein the plurality of magnetic material portions is formed such that the gaps are connected to the side walls and extend into the magnetic material portions from the side walls.

* * * * *